United States Patent [19]

Pein

[11] Patent Number: 5,382,818
[45] Date of Patent: Jan. 17, 1995

[54] LATERAL SEMICONDUCTOR-ON-INSULATOR (SOI) SEMICONDUCTOR DEVICE HAVING A BURIED DIODE

[75] Inventor: Howard B. Pein, Briarcliff Manor, N.Y.

[73] Assignee: Philips Electronics North America Corporation, New York, N.Y.

[21] Appl. No.: 164,230

[22] Filed: Dec. 8, 1993

[51] Int. Cl.⁶ .................... H01L 27/01; H01L 27/13; H01L 29/78
[52] U.S. Cl. .................... 257/347; 257/336; 257/344; 257/492; 257/493
[58] Field of Search ............... 257/336, 339, 344, 347, 257/492, 493

[56] References Cited

U.S. PATENT DOCUMENTS

| | | | |
|---|---|---|---|
| 4,523,213 | 6/1985 | Konaka et al. | 257/347 |
| 5,059,547 | 10/1991 | Shirai | 437/40 |
| 5,113,236 | 5/1992 | Arnold et al. | 357/41 |
| 5,237,193 | 8/1993 | Williams et al. | 257/344 |

FOREIGN PATENT DOCUMENTS

| | | |
|---|---|---|
| 0497577 | 8/1992 | European Pat. Off. |
| 60-189264 | 9/1985 | Japan |
| 62-5662 | 1/1987 | Japan |

OTHER PUBLICATIONS

"Novel Silicon-On-Insulator MOSFET for High--Voltage Integrated Circuits" *Electronics Letters*, vol. 25, No. 8 Apr. 13, 1989, P. Ratnam.
"Realization of High Breakdown Voltage (>700v) In Thin SOI Devices" S. Merchant et al, 3rd Int. Symp. on Power Semiconductor Devices and IC's pp. 31–35, 1991.
"Thin Layer High-Voltage Devices" (Resurf Devices) J. A. Appels et al, *Philips J. Res.* 35, 1–13, 1980.
"Extension of Resurf Principle to Dielectrically Isolated Power Devices" Y. S. Huang et al, 3rd Int. Symp. on Power Semiconductor Devices and IC's pp. 27–30, 1991.
"High Voltage Silicon-On-Insulator (SOI) MOSFETs" Q. Lu et al, 3rd Int. Symp. on Power Semiconductor Devices and IC's pp. 36–39, 1991.

*Primary Examiner*—J. Carroll
*Attorney, Agent, or Firm*—Steven R. Biren

[57] ABSTRACT

A lateral Semiconductor-On-Insulator (SOI) device includes a substrate, a buried insulating layer on the substrate, and a lateral semiconductor device such as an LDMOS transistor, an LIGBT or a lateral thyristor on the insulating layer. The semiconductor device (in the case of an LDMOS transistor) includes a source region, a channel region, an insulated gate electrode over the channel region, a lateral drift region formed of a continuous layer of a lightly-doped semiconductor material on the buried insulating layer, and a drain contact region which is laterally spaced apart from the channel region and connected to the channel region by the drift region. A buried diode is formed in the substrate, and is electrically coupled to the drain contact region by a portion of the drift region which extends laterally in the region between the drain contact region and the buried diode.

5 Claims, 3 Drawing Sheets

LATERAL SEMICONDUCTOR-ON-INSULATOR (SOI) SEMICONDUCTOR DEVICE HAVING A BURIED DIODE

BACKGROUND OF THE INVENTION

The invention is in the field of Semiconductor-On-Insulator (SOI) devices, and relates specifically to lateral SOI devices for high-voltage and power applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One category of power devices that has shown considerable promise uses a semiconductor (usually silicon) layer provided on an insulating layer in a lateral configuration. A typical lateral double-diffused MOS (LDMOS) transistor in an SOI configuration is shown in U.S. Pat. No. 5,059,547. Such devices, although an improvement over earlier devices, are still a compromise in terms of the tradeoff between breakdown voltage and "on" resistance.

A promising method for obtaining high voltage lateral SOI transistors is to use a structure with a buried diode for connecting the SOI layer to the underlying substrate. Such a device is shown in FIG. 1(b) in Lu et al., "HIGH VOLTAGE SILICON-ON-INSULATOR (SOI) MOSFET'S", 3rd Int. Symp. on Power Semiconductor Devices and ICs, pp. 36–39, 1991. To support high voltages, this structure uses the well-known REduction of SURface Fields (RESURF) technique developed by Appels and Vaes, whereby the drift region of the device is depleted by the underlying substrate. As with conventional bulk technology, these SOI devices use a depletion region in the substrate to support most of the applied drain potential. The buried diode in the SOI structure is necessary so that electrons generated in the depletion region can be extracted through the reverse-biased diode and flow to the drain contact. Without this path for electrons, the deep-depletion region in the substrate would collapse due to the formation of an inversion layer along the underside of the buried oxide and the breakdown voltage of the device would be severely degraded.

With the buried diode structure, most of the applied drain potential is dropped in the substrate, as opposed to more conventional fully-isolated approaches where the voltage is dropped across the buried oxide. This allows the use of thinner buried oxides and SOI thicknesses that are simpler to process. Conventionally the buried diode has been formed by etching deep, high aspect-ratio trenches through the SOI layer with subsequent refill of the trenches with a conducting material such as highly-doped polysilicon to provide an escape path to the drain contact for electrons generated in the substrate. However, this is a relatively difficult, complex, costly and time-consuming fabrication process.

Accordingly, it would be desirable to have a lateral SOI device with a buried diode having a structure which can be easily and economically manufactured. Additionally, it would be desirable to have such an SOI device in which buried doping layers can be easily incorporated in order to improve the breakdown/"on" resistance trade-off as compared to prior-art devices.

SUMMARY OF THE INVENTION

It is therefore an object of the invention to provide a lateral SOI device having a high breakdown voltage, low "on" resistance and other desirable operational properties in a device configuration which can be economically manufactured using known processing technology. More particularly, it is an object of the invention to provide a lateral SOI device in which a buried diode structure and its associated contact can be easily and economically provided, and in which buried doping layers to improve the breakdown/"on" resistance trade-off of the device can be easily incorporated.

In accordance with the invention, these objects are achieved by providing a lateral SOI device with a buried diode in its substrate, and providing the drift region of the device as a continuous layer of lightly-doped monocrystalline semiconductor material which also extends laterally into the region between the drain contact region of the device and the buried diode in order to electrically couple the buried diode to the drain contact region without the need to form a separate diode contact region, thereby avoiding the complex and relatively expensive techniques needed to form such a separate contact region.

The invention is based on the recognition that the buried diode serves only to extract electrons generated in the depletion layer in the substrate, and thus only a small current flows through the buried diode to the drain contact region at the surface of the device. As a consequence, the path between the buried diode and the surface drain contact region does not have to be a difficult-to-form highly conductive contact, as in the prior art, but instead may advantageously be a portion of the lightly-doped drift region. As a result, lateral SOI devices with a buried diode can be provided which are both simpler and substantially easier to manufacture than those of the prior art.

Additionally, by using a continuous epitaxial layer over a seed layer for the drift region and buried diode contact region, buried layers can be easily incorporated into the device structure in order to improve the breakdown voltage/"on" resistance trade-off of the device. In a preferred embodiment of the invention, for example, a buried semiconductor layer, of opposite contact conductivity type to that of the drift region, is provided on the buried insulating layer of the SOI device and extends beneath the drift region from the channel region toward the drain region. This buried layer helps to deplete the drift region of the SOI device, thereby improving the breakdown voltage/"on" resistance trade-off.

BRIEF DESCRIPTION OF THE DRAWING

The invention may be more completely understood with reference to the following detailed description, to be read in conjunction with the accompanying drawing, in which.

Figure 1:
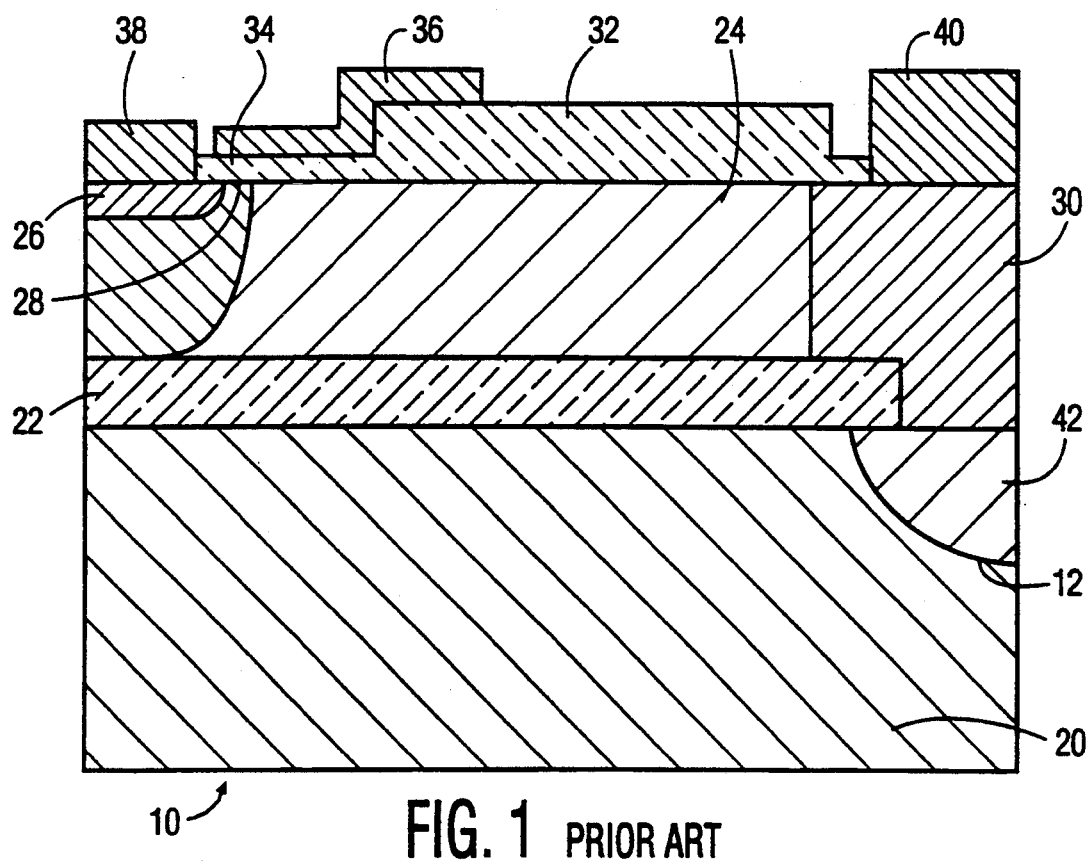
FIG. 1 shows a cross-sectional view of a prior-art LDMOS SOI transistor.

In the drawing, semiconductor regions having the same conductivity type are generally hatched in the same direction, and it should be noted that the figures are not drawn to scale.

DESCRIPTION OF THE PREFERRED EMBODIMENTS

A typical prior-art LDMOS SOI transistor 10 with a buried diode 12 is shown in FIG. 1. This transistor includes a substrate 20, typically of p-type silicon material having a doping concentration of $10^{12}-5\times10^{14}$ at/cm$^3$, on which is provided a buried insulating layer 22, typically a silicon oxide layer having a thickness of several microns. A semiconductor layer 24, here an n-type silicon layer having a thickness of about 1 micron up to 10 microns is provided on the buried insulating layer 22. Advantageously, semiconductor layer 24 may have doping dose of about $0.5\times10^{12}$ to $2\times10^{12}$ at/cm$^2$. A lateral semiconductor device, in this case an LDMOS transistor, is provided in the semiconductor layer 24 (sometimes called a "top layer") on the buried insulating layer 22. Other types of lateral semiconductor devices that may be provided in the semiconductor layer 24 include a lateral insulated-gate bipolar transistor (LIGBT) or a lateral thyristor.

The LDMOS transistor shown in FIG. 1 includes an n-type source region 26 having a high doping concentration at the surface of $10^{19}$ to $10^{21}$ at/cm$^3$, a p-type channel region 28 having a doping concentration at the surface of between $5\times10^{14}$ and $5\times10^{17}$ at/cm$^3$, and a drain region which includes highly-doped n-type contact region 30, which has a doping concentration at the surface of $10^{19}$ to $10^{21}$ at/cm$^3$. In the above-mentioned Lu et al. paper, for example, the corresponding contact region has a doping concentration of $5\times10^{19}$ at/cm$^3$ for optimized results, and is formed by an etch and refill technique, which would typically use polysilicon.

In a manner well known to those skilled in the art, an insulating layer, such as oxide layer 32, is provided on semiconductor layer 24 between the source and drain regions of the device, with a thinner gate oxide insulating layer 34 being provided over the channel region and a portion of the source region. The insulating layer (field oxide layer) 32 may typically be about 0.1–1.0 microns thick, while the thinner gate oxide 34 is about 0.01–0.1 microns thick. A gate electrode 36, typically of polysilicon, is provided on the LOCOS field oxide 32 and gate oxide 34, and source electrode 38 and drain electrode 40, typically of aluminum or other suitable metal, are provided over the source and drain regions, respectively.

The prior-art device shown in FIG. 1 includes buried diode 12, in this example formed between the p-type substrate 20 and a buried region 42, typically an n-type region having a surface concentration of about $10^{17}$ at/cm$^3$ and a thickness of about 1 micron, although these parameters are not critical. As described above, in this type of device an electrically-conductive connection must be made between buried region 42 of the buried diode 12 and the drain electrode 40. In the prior art, this connection is provided by highly-doped n-type contact region 30, formed by etching a deep, high aspect-ratio trench through the SOI layer (24, 22) and then refilling the trench with a highly-conductive material, typically polysilicon, followed by etch-back planarization. However, this is a relatively difficult, complex, costly and time-consuming process, and a more simple and economical configuration would be desirable.

Figure 2:
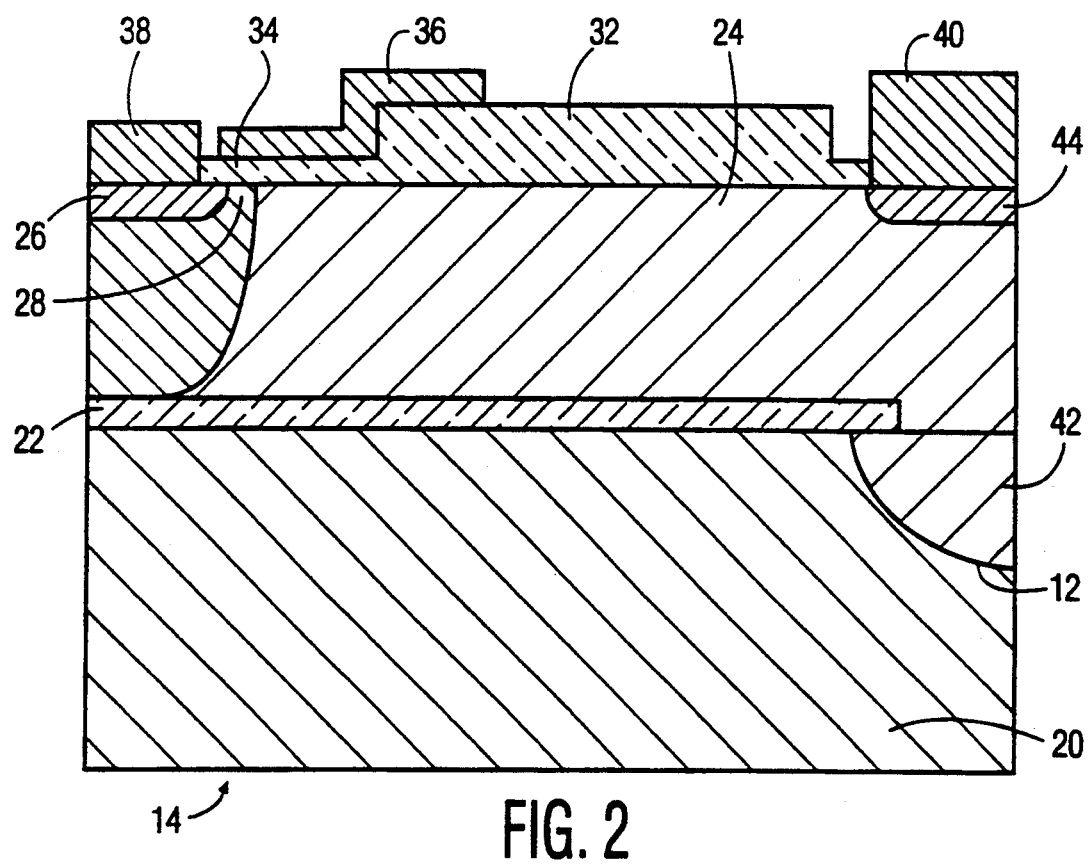
FIG. 2 shows a cross-sectional view of a first embodiment of an LDMOS SOI transistor in accordance with the invention.

A simpler and more easily and economically manufactured SOI device 14 in accordance with a first embodiment of the invention is shown in FIG. 2. In this figure, like regions to those shown in FIG. 1 have been provided with like reference numerals, and are further described only to the extent that they differ from the previously-described regions.

Based upon the recognition that the buried diode 12 serves only to extract the electrons generated in the depletion layer in the substrate, so that only a small current flows through the buried diode to the drain contact 40, it was concluded that the path between the buried diode and the surface contact does not have to be highly conductive, as it was in the prior art, and that instead a portion of the lightly-doped monocrystalline semiconductor material of the drift region 24 can be used as a path for extracting electrons.

In the configuration shown in FIG. 2, the highly-doped contact region 30 of FIG. 1 is eliminated, thus obviating the need for etching a deep, high aspect-ratio trench and performing a refill operation with polysilicon, and instead a simple, easily-formed conventional drain contact region 44 is provided at the surface of drift region layer 24. Highly-doped drain contact region 44 is in this example an n+ region having a doping concentration at the surface of between about $1\times10^{19}$ to $1\times10^{21}$ at/cm$^3$, with a shallow junction depth typically less than 0.5 micron, although the precise nature of the drain contact region is not critical to the invention. Additionally, the thickness of buried insulating layer 22 in this example can be between 0.1 micron and 0.5 micron, for ease and economy of manufacture.

Devices in accordance with the present invention can be easily and economically manufactured starting with an SOI wafer with a thin buried oxide (typically less than 0.5 micron) and a thin silicon layer (also typically less than 0.5 micron). The SOI material is masked in a conventional manner to etch away the thin silicon and thin oxide at the location where the buried region (42) is to be formed. Because the silicon and oxide layers are so thin, this step is much simpler, faster and more economical than etching high aspect-ratio trenches as required in the prior art.

The buried region 42 of the buried diode 12 is then formed by a conventional technique such as implantation, and buried layers can also be formed in the SOI film by implantation, followed by annealing. Subsequently, a monocrystalline, lightly-doped epitaxial layer (24) is grown over the thin SOI layer, the buried layers in the SOI film (if any) and the buried region 42, to a thickness in the order of 5 microns. The epitaxial layer is seeded by the thin SOI layer in the regions above the buried oxide insulating layer, and by the substrate above the buried region 42. Once the epitaxial layer 24 has been grown, a conventional processing sequence is followed to complete the device structure. The key advantage of the invention is that a contacted buried-diode structure can be achieved without having to etch deep, high aspect-ratio trenches, and without the need for polysilicon refill and etch-back planarization as in the prior art. Furthermore, the process described above lends itself to easily and economically providing various buried layers above the buried insulating layer in order to achieve further improvements in device performance.

Figure 3:
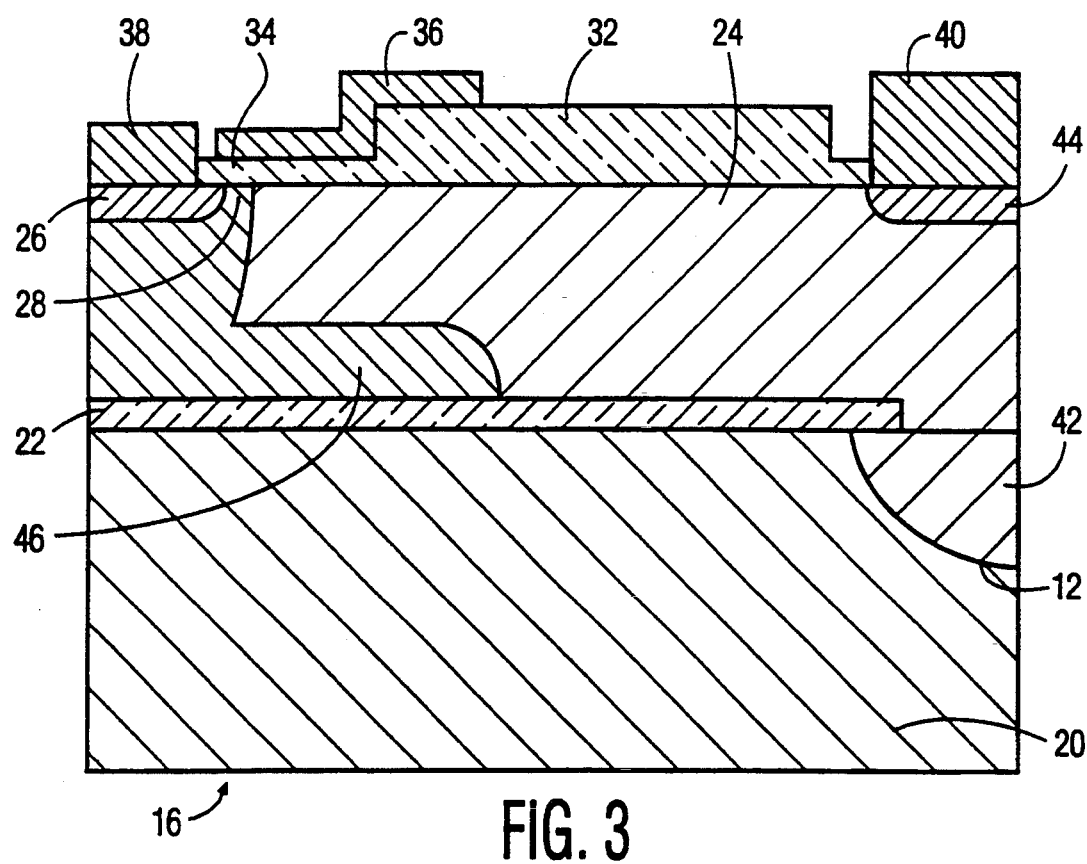
FIG. 3 shows a cross-sectional view of an LDMOS SOI transistor in accordance with a second embodiment of the invention.

Thus, as shown in FIG. 3, a p-type buried semiconductor layer 46 is provided on the buried insulating layer in SOI device 16 and extends beneath the drift region from the channel region 28 toward the drain region. This p-type buried layer may have a doping dose of between about $1.0 \times 10^{11}$ and $1.5 \times 10^{12}$ at/cm$^2$ and a thickness of between about 0.1 micron and 0.3 micron. Using such a buried semiconductor layer 46 will help to deplete the drift region 24 and thereby improve the breakdown voltage/"on" resistance trade-off of the device. Furthermore, the ability to easily and economically provide buried layers of either conductivity type on the buried insulating layer can prove to be a major advantage in the manufacture of associated low-voltage structures that would typically be fabricated along with the devices shown in a Power Integrated Circuit (PIC) device.

In the embodiments shown, the source, drift region and drain regions are of n-type conductivity, with the channel region being of p-type conductivity. However, it should be understood that the conductivity types of these regions may all be reversed simultaneously.

In summary, the present invention provides a lateral SOI device having a high breakdown voltage, low "on" resistance and other desirable operational properties in a device configuration which can be economically manufactured using known processing technology. As described, these advantages are achieved by providing a lateral SOI device with a buried diode in its substrate, and providing the drift region of the device as a continuous layer of lightly-doped monocrystalline semiconductor material which also extends laterally into the region between the drain contact region of the device and the buried diode.

While the invention has been particularly shown and described with reference to several preferred embodiments thereof, it will be understood by those skilled in the art that various changes in form and detail may be made without departing from the spirit or scope of the invention.

What is claimed is:

1. A lateral Semiconductor-on-Insulator (SOI) device comprising a substrate, a buried insulating layer on said substrate, and a lateral semiconductor device on said insulating layer, said semiconductor device comprising a source region of a first conductivity type, a channel region of a second conductivity type opposite to that of the first, an insulated gate electrode over said channel region, a lateral drift region of said first conductivity type at least partly on said buried insulating layer, and a drain contact region of said first conductivity type, laterally spaced apart from said channel region and connected thereto by said drift region, said substrate being of the second conductivity type, and a buried region of the first conductivity type in said substrate, adjacent a surface thereof, and beneath said drain contact region, said buried region forming a buried diode with said substrate, characterized in that said drift region comprises a continuous layer of substantially constantly and lightly-doped monocrystalline semiconductor material which also extends laterally into a region between said drain contact region and said buried region and electrically couples said buried region to said drain contact region.

2. A lateral SOI device as in claim 1, wherein said continuous layer of lightly-doped monocrystalline semiconductor material has a doping dose of between about $0.5 \times 10^{12}$ at/cm$^2$ and $2 \times 10^{12}$ at/cm$^2$.

3. A lateral SOI device as in claim 2, wherein said layer of lightly-doped monocrystalline semiconductor material comprises an epitaxial layer having a thickness of between about 1.0 micron and 10 microns.

4. A lateral SOI device as in claim 1, further comprising a buried semiconductor layer of said second conductivity type, on said buried insulating layer and extending beneath said drift region from said channel region toward said drain region.

5. A lateral SOI device as in claim 4, wherein said buried semiconductor layer has a doping dose of between about $1.0 \times 10^{11}$ and $1.5 \times 10^{12}$ at/cm$^2$ and a thickness of between about 0.1 micron and 0.3 micron.

* * * * *